United States Patent

Wang et al.

(10) Patent No.: US 9,438,180 B2
(45) Date of Patent: Sep. 6, 2016

(54) RADIO FREQUENCY POWER AMPLIFIER AND METHOD FOR INCREASING POWER ADDED EFFICIENCY AND LINEARITY

(71) Applicant: REALTEK SEMICONDUCTOR CORP., Hsinchu (TW)

(72) Inventors: Po-Chih Wang, Hsinchu County (TW); Ya-Wen Yang, Kaohsiung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/692,006

(22) Filed: Apr. 21, 2015

(65) Prior Publication Data

US 2015/0311873 A1 Oct. 29, 2015

(30) Foreign Application Priority Data

Apr. 23, 2014 (TW) .............................. 103114690 A

(51) Int. Cl.

| H03F 3/191 | (2006.01) |
|---|---|
| H03F 1/56 | (2006.01) |
| H03F 3/19 | (2006.01) |
| H03F 3/24 | (2006.01) |
| H03F 1/32 | (2006.01) |

(52) U.S. Cl.
CPC ............ *H03F 1/565* (2013.01); *H03F 1/3205* (2013.01); *H03F 3/19* (2013.01); *H03F 3/245* (2013.01); *H03F 2200/06* (2013.01); *H03F 2200/09* (2013.01); *H03F 2200/222* (2013.01); *H03F 2200/387* (2013.01); *H03F 2200/451* (2013.01); *H03F 2200/534* (2013.01); *H03F 2200/541* (2013.01); *H03F 2200/72* (2013.01)

(58) Field of Classification Search
CPC ....................................................... H03F 3/191

USPC .................................................. 330/302, 305
See application file for complete search history.

(56) References Cited

U.S. PATENT DOCUMENTS

| 5,742,205 A | 4/1998 | Cowen et al. | |
|---|---|---|---|
| 5,945,879 A * | 8/1999 | Rodwell ................ | H03F 3/1935 330/294 |
| 6,329,877 B1 * | 12/2001 | Bowen .................. | H03F 1/0288 330/124 R |
| 2010/0148877 A1 * | 6/2010 | Oakley ................. | H03F 1/0288 330/295 |
| 2010/0327969 A1 * | 12/2010 | Jung ..................... | H03F 1/0277 330/124 R |
| 2012/0229217 A1 * | 9/2012 | Kawano ................ | H03F 1/0261 330/295 |
| 2014/0094129 A1 * | 4/2014 | Chang ..................... | H03F 3/19 455/73 |

* cited by examiner

*Primary Examiner* — Henry Choe
(74) *Attorney, Agent, or Firm* — Li & Cai Intellectual Property (USA) Office

(57) ABSTRACT

A radio frequency (RF) power amplifier is disclosed. The RF power amplifier includes an impedance transformation circuit, a current unit gain amplifier, and an output match circuit. The impedance transformation circuit receives a first input power signal and outputs a second input power signal correspondingly, wherein the impedance transformation circuit transforms an input impedance to an output impedance according to an impedance matching parameter for increasing power added efficiency of a pre-stage circuit. The current unit gain amplifier provides a linear transimpedance so as to transmit an input current to an output impedance, and then generate a linear output power for increasing power added efficiency of the current unit gain amplifier, wherein the impedance matching parameter is determined by a first system voltage, a second system voltage, and a predetermined power gain value.

14 Claims, 5 Drawing Sheets

US 9,438,180 B2

RADIO FREQUENCY POWER AMPLIFIER AND METHOD FOR INCREASING POWER ADDED EFFICIENCY AND LINEARITY

BACKGROUND

1. Technical Field

The present invention relates to a radio frequency (RF) power amplifier, in particular, to a RF power amplifier for increasing a power added efficiency and a linearity.

2. Description of Related Art

Different specifications for the power transmitters in communication systems are needed because there are many methods for modulating signals. In recent years, an orthogonal frequency-division multiplexing (OFDM) modulated signal has been used in wireless communication networks (e.g., the communication network suitable for IEEE 802.11a/b/g specification) which is similar to a modulated method of Amplitude Modulation (AM). Therefore, it needs a high-linearity power amplifier. In general, high-linearity power amplifiers use common source (CS) power amplifiers of Class A or Class AB to increase the linearity. To increase the communication quality, it is essential to further increase the linearity and the power added efficiency of the power amplifier.

SUMMARY

An exemplary embodiment of the present disclosure provides a radio frequency (RF) power amplifier electrically connected to a pre-stage circuit to receive a first input power signal. The RF power amplifier includes an impedance transformation circuit, a current unit gain amplifier, and an output match circuit. The impedance transformation circuit is electrically connected to the pre-stage circuit. The impedance transformation circuit is configured for receiving the first input power signal and correspondingly outputting a second input power signal, wherein the impedance transformation circuit executes a power matching by an impedance transformation for increasing a power added efficiency (PAE) and a linearity of the RF power amplifier. The current unit gain amplifier is electrically connected to the impedance transformation circuit. The current unit gain amplifier is configured for receiving the second input power signal and correspondingly outputting an output power signal, wherein the current unit gain amplifier determines a predetermined power gain value based on an impedance reference value and an input impedance of the current unit gain amplifier is substantially made equal to an input impedance of the RF power amplifier by the impedance transformation circuit. The output match circuit is electrically connected to the current unit gain amplifier. The output match circuit has the impedance reference value for receiving the output power signal to execute the power matching and correspondingly outputs a RF output signal.

An exemplary embodiment of the present disclosure provides a method for increasing a PAE and a linearity, which is adapted for a RF power amplifier. The RF power amplifier is electrically connected to a pre-stage circuit to receive a first input power signal. The RF power amplifier includes an impedance transformation circuit, a current unit gain amplifier, and an output match circuit. The impedance transformation circuit is electrically connected to the pre-stage circuit and a first system voltage. The current unit gain amplifier is electrically connected to the impedance transformation circuit and a second system voltage. The output match circuit is electrically connected to the current unit gain amplifier. The method for increasing the PAE and the linearity includes the following steps: receiving the first input power signal and correspondingly outputting a second input power signal by the impedance transformation circuit, wherein the impedance transformation circuit executes a power matching by an impedance transformation for increasing the PAE and the linearity of the RF power amplifier; receiving the second input power signal and correspondingly outputting an output power signal by the current unit gain amplifier, wherein the current unit gain amplifier determines a predetermined power gain value based on an impedance reference value and an input impedance of the current unit gain amplifier is substantially made equal to an input impedance of the RF power amplifier by the impedance transformation circuit; and receiving the output power signal to execute the power matching and correspondingly outputting a RF output signal by the output match circuit, wherein the output match circuit has the impedance reference value.

To sum up, the exemplary embodiments of the present disclosure provide a RF power amplifier and a method for increasing power added efficiency and linearity, which can transform an input impedance to an output impedance according to an impedance matching parameter by an impedance transformation circuit. Accordingly, it can increase the power added efficiency and the linearity of the RF power amplifier in the condition of receiving a fixed input power.

In order to further understand the techniques, means and effects of the present invention, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present invention.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain the principles of the present invention.

DESCRIPTION OF THE EXEMPLARY EMBODIMENTS

Figure 1:
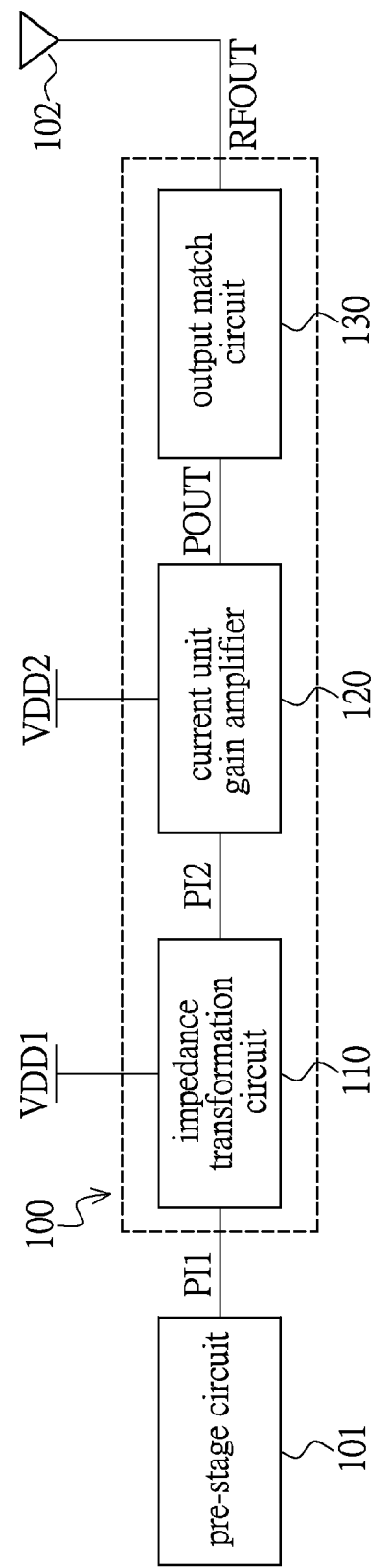
FIG. 1 is a block diagram of a RF power amplifier according to an exemplary embodiment of the present disclosure.

Example embodiments will be described below in more detail with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough and complete, and will fully convey the scope of the disclosure to those skilled in the art. In the drawings, the sizes and relative sizes of layers and regions may be exaggerated for clarity. Like reference numbers refer to like elements throughout.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below and could be termed a second element, component, region, layer or section without departing from the teachings of the present disclosure. As used herein, the term "and/or" includes any and all combinations of one or more of the associated listed items.

The following instruction describes a radio frequency (RF) power amplifier and a method for increasing the power added efficiency and the linearity via a plurality of embodiments with corresponding drawings. However, the embodiments below are not for restricting the scope of the present disclosure.

[Embodiment of the RF Power Amplifier]

Please refer to FIG. 1, which shows a block diagram of a RF power amplifier according to an exemplary embodiment of the present disclosure. As shown in FIG. 1, a radio frequency (RF) power amplifier 100 includes an impedance transformation circuit 110, a current unit gain amplifier 120, and an output match circuit 130. The impedance transformation circuit 110 is electrically connected to a pre-stage circuit 101 and a first system voltage VDD1. The current unit gain amplifier 120 is electrically connected to the impedance transformation circuit 110 and a second system voltage VDD2. The output match circuit 130 is electrically connected to the current unit gain amplifier 120 and an antenna 102. The present embodiment does not limit the type of the antenna 102.

The impedance transformation circuit 110 is configured to receive a first input power signal PI1 and accordingly output a second input power signal PI2 according to an impedance matching parameter by the magnetic energy conversion (i.e., the mutual inductance effect). Furthermore, the impedance transformation circuit 110 executes a power matching by an impedance transformation, i.e., the higher input impedance is transformed into the lower output impedance or the lower input impedance is transformed into the higher output impedance to achieve the power matching. Accordingly, it can adjust or further increase a power added efficiency (PAE) and a linearity of the RF power amplifier.

The current unit gain amplifier 120 is configured to receive a second input power signal PI2 and accordingly output an output power signal POUT. The current unit gain amplifier 120 determines a predetermined power gain value based on an impedance reference value. An input impedance of the current unit gain amplifier 120 is substantially made equal to an input impedance of the RF power amplifier 100 by executing the impedance transformation circuit 110. More specifically, in the present disclosure, the designer can design the predetermined power gain value according to the actual application and can design the impedance reference value by the predetermined power gain value, wherein the impedance reference value is an input impedance of the output match circuit 130. In addition, the impedance matching parameter is determined by the first system voltage VDD1, the second system voltage VDD2, and the predetermined power gain value.

The output match circuit 130 is configured to receive the output power signal POUT to execute the power matching for providing better efficiency of power matching and accordingly output a RF output signal RFOUT.

The following description further elaborates a working principle of the RF power amplifier 100.

Because a transimpedance of the current unit gain amplifier 120 of the present disclosure has a high-linearity, it will cause there to be a linear relationship between the output power and the input current. When the output current of the pre-stage circuit 101 is a linear current, it achieves the purpose of the high-linearity power amplifier. Because the power gain of the current unit gain amplifier 120 is a limited value, the output power of the pre-stage circuit 101 can be decreased in a condition of fixed transmission power of the antenna, so as to generate a linear current to provide the linear current to the current unit gain amplifier 120 in a condition of slightly increasing the power consumption of the system. Moreover, the impedance transformation circuit 110 of the present disclosure is electrically connected between the current unit gain amplifier 120 and the pre-stage circuit 101 to amplify the current outputted from the pre-stage circuit 101 by the magnetic energy conversion within the impedance transformation circuit 110, thereby the PAE of the RF power amplifier 100 can be increased. More specifically, when the impedance transformation circuit 110 receives the current transmitted from the pre-stage circuit 101 or the first input power signal PI1, the impedance transformation circuit 110 executes the power matching by the magnetic energy conversion, i.e., higher impedance is transformed into lower impedance or lower impedance is transformed into higher impedance). This means that the impedance transformation circuit 110 transforms the first input power signal PI1 into the second input power signal PI2 based on the impedance matching parameter. It is worth mentioning that, in the present embodiment, the impedance matching parameter can be determined by the first system voltage VDD1, the second system voltage VDD2, and the predetermined power gain value, wherein the predetermined power gain value can be designed by the designer according to the actual application. The impedance matching parameter directly affects the transform efficiency of the impedance transformation circuit 110, and further affects the efficiency of adjusting the PAE of the pre-stage circuit 101.

Next, the current unit gain amplifier 120 receives the current transmitted from the impedance transformation circuit 110 or the second input power signal SI2. Because the amplification factor of the current unit gain amplifier 120 is substantially equal to 1, the current unit gain amplifier 120 of the present disclosure is analyzed from the power aspect. The power gain (i.e., the predetermined power gain value) of the current unit gain amplifier 120 is directly proportional to the impedance reference value (i.e., the input impedance of the output match circuit 130). Therefore, the designer can design for the predetermined power gain value wanted and gain the impedance reference value based on the predetermined power gain value. It is worth noting that, in the present embodiment, the designer can do optimal design according to the aforementioned values. The present disclosure is not limited thereto.

Afterwards, the current unit gain amplifier 120 transmits the output power signal POUT to the output match circuit 130 to execute the power matching of the output terminal.

Then the output match circuit 130 transmits the RF output signal RFOUT to the antenna 102 to emit the signal correspondingly.

For a specific instruction on an operational process of the RF power amplifier 100 of the present disclosure, at least one of the embodiments provides further instruction.

In the following embodiments, only parts different from embodiments in FIG. 1 are described, and the omitted parts are indicated to be identical to the embodiments in FIG. 1. In addition, similar reference numbers or symbols refer to the same elements.

[Another Embodiment of the RF Power Amplifier]

Figure 2:
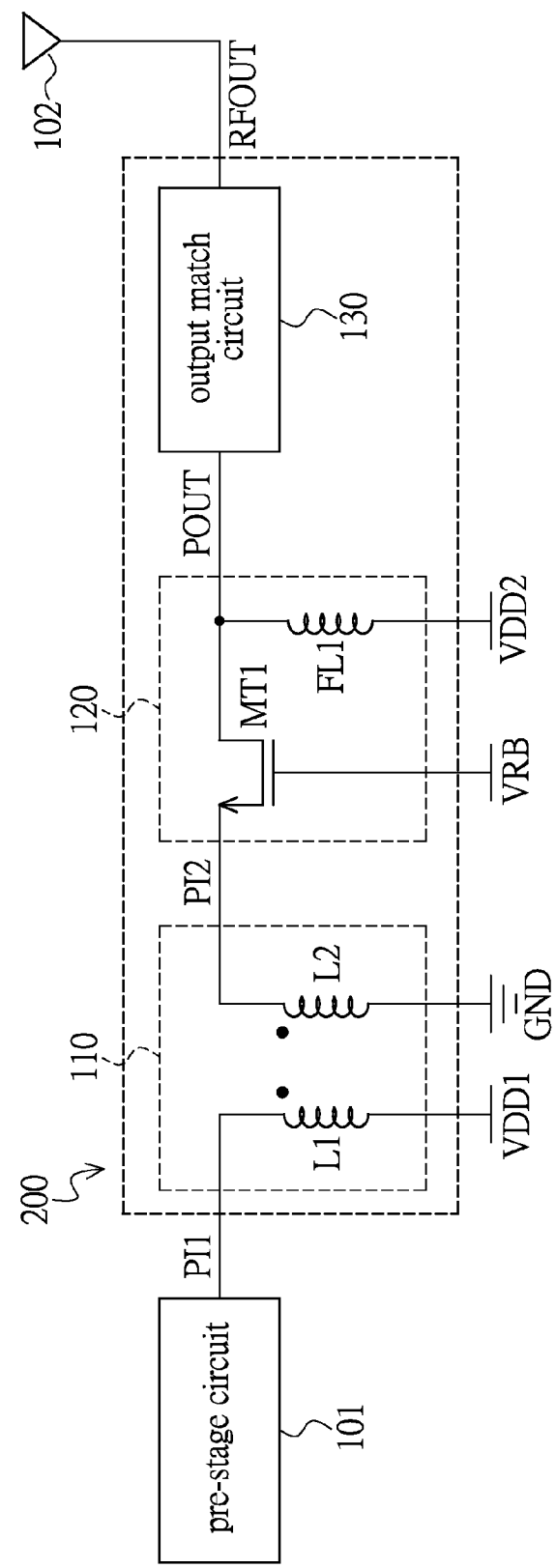
FIG. 2 is a block diagram of a RF power amplifier according to another exemplary embodiment of the present disclosure.

Please refer to FIG. 2, which shows a block diagram of a RF power amplifier according to another exemplary embodiment of the present disclosure. As shown in FIG. 2, the difference between this embodiment and the above-mentioned embodiment of FIG. 1 is that the impedance transformation circuit 110 includes a first inductor L1 and a second inductor L2. The current unit gain amplifier 120 includes a first transistor MT1 and a first current-fed inductor FL1. A first end of the first inductor L1 is electrically connected to the pre-stage circuit 101 to receive the first input power signal PI1. A second end of the first inductor L1 is electrically connected to the first system voltage VDD1, wherein the first inductor L1 has a first inductance value. A first end of the second inductor L2 is electrically connected to the current unit gain amplifier 120 to output the second input power signal PI2. A second end of the second inductor L2 is electrically connected to the ground voltage GND, wherein the second inductor L2 has a second inductance value. A source of the first transistor MT1 is electrically connected to the first end of the second inductor L2 to receive the second input power signal PI2. A gate of the first transistor MT1 is electrically connected to a reference bias voltage VRB, i.e., AC ground. A first end of the first current-fed inductor FL1 is electrically connected to a drain of the first transistor MT1 and the output match circuit 130 to output the output power signal POUT. A second end of the first current-fed inductor FL1 is electrically connected to the second system voltage VDD2, wherein the first current-fed inductor FL1 has a first current-fed inductance value.

The following description further elaborates the working principle of the RF power amplifier 200.

In the present embodiment, because the first transistor MT1 is common gage (CG) configuration, the transimpedance of the first transistor MT1 is linear and the power gain is a limited value. Therefore, in the present disclosure, the impedance transformation circuit 110 with the first inductor L1 and the second inductor L2 is electrically connected between the pre-stage circuit 101 and the first transistor MT1, thereby amplifying the current outputted from the pre-stage circuit 101 through the magnetic energy conversion of the first inductor L1 and the second inductor L2 to increase the PAE of the pre-stage circuit 101. More specifically, when the first inductor L1 receives the current transmitted from the pre-stage circuit 101 or the first input power signal PI1, the first inductor L1 transmits the power to the second inductor L2 by the magnetic energy conversion (i.e., the mutual inductance effect), wherein the ratio between the current flowing through the second inductor L2 and the current flowing through the first inductor L1 is the impedance matching parameter. It is worth noting that the impedance matching parameter is defined by the ratio between the first inductance value and the second inductance value. Because the impedance matching parameter is determined by the first system voltage VDD1, the second system voltage VDD2, and the predetermined power gain value, the designer can design the ratio between the first inductance value and the second inductance value based on the impedance matching parameter, thereby adjusting the PAE of the pre-stage circuit 101.

Next, the second inductor L2 transmits the current or the second input power signal PI2 to the first transistor MT1, wherein the first inductor L1 and the second inductor L2 transmit the first input power signal PI1 to the second input power signal PI2 based on the impedance matching parameter. Because the amplification factor of the first transistor MT1 (i.e., the first transistor MT1 is operated as CG configuration) is substantially equal to 1, the first transistor MT1 of the present disclosure is analyzed from the power aspect. The power gain of the first transistor MT1 (i.e., the predetermined power gain value) is equal to the product between the resistance value of the input resistor of the output match circuit 130 and the transconductance value of the first transistor MT1. Therefore, the designer can design an output power wanted of the antenna to gain the resistance value of the input resistor of the output match circuit 130 based on the second system voltage VDD2. The transconductance value of the first transistor MT1 is gained by the predetermined power gain value wanted. The impedance matching parameter of the impedance transformation circuit 110 is determined by the first system voltage VDD1, the transconductance value of the first transistor MT1, and the output power provided from the pre-stage circuit 101 (i.e., the power gain of the first transistor MT1 is subtracted from the transmission power of the antenna, which is indicated in "dB"). Similarly, the designer can do optimal design according to the aforementioned values. The present disclosure is not limited thereto.

For a specific instruction on an operational process of the RF power amplifier 200 of the present disclosure, at least one of the following embodiments is for further instruction.

In the following embodiments, only parts different from the embodiments in FIG. 2 described, and the omitted parts are indicated to be identical to the embodiments in FIG. 2. In addition, similar reference numbers or symbols refer to the same elements.

[Another Embodiment of the RF Power Amplifier]

Figure 3:
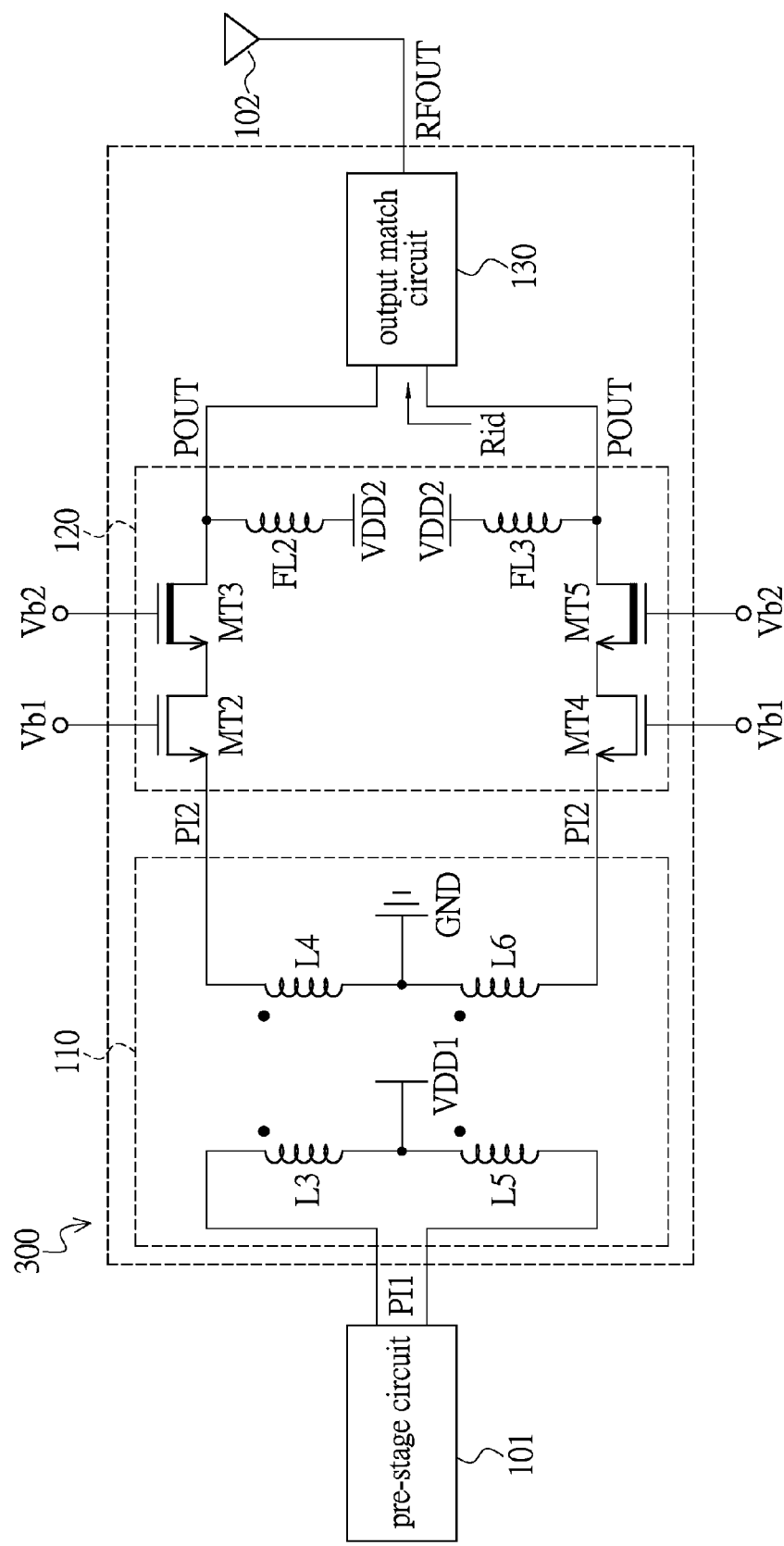
FIG. 3 is a block diagram of a RF power amplifier according to another exemplary embodiment of the present disclosure.

Please refer to FIG. 3, which shows a block diagram of a RF power amplifier according to another exemplary embodiment of the present disclosure. As shown in FIG. 3, the difference between this embodiment and the above-mentioned embodiment of FIG. 2 is that the impedance transformation circuit 110 includes a third inductor L3, a fourth inductor L4, a fifth inductor L5, and a sixth inductor L6. The current unit gain amplifier 120 includes a second transistor MT2, a third transistor MT3, a second current-fed inductor FL2, a fourth transistor MT4, a fifth transistor MT5, and a third current-fed inductor FL3.

A first end of the third inductor L3 is electrically connected to the pre-stage circuit 101 to receive the first input power signal PI1. A second end of the third inductor L3 is electrically connected to the first system voltage VDD1, wherein the third inductor L3 has a third inductance value. A first end of the fourth inductor L4 is electrically connected to the current unit gain amplifier 120 to output the second input power signal PI2. A second end of the fourth inductor L4 is electrically connected to the ground voltage GND, wherein the fourth inductor L4 has a fourth inductance value. The ratio between the third inductance value and the fourth inductance value is designed to be a first high-side impedance matching parameter. A first end of the fifth inductor L5 is electrically connected to the pre-stage circuit 101 to receive the first input power signal PI1. A second end of the fifth inductor L5 is electrically connected to the first system voltage VDD1, wherein the fifth inductor L5 has a fifth inductance value. A first end of the sixth inductor L6 is electrically connected to the current unit gain amplifier 120 to output the second input power signal PI2. A second end of the sixth inductor L6 is electrically connected to the ground voltage GND, wherein the sixth inductor L6 has a sixth inductance value. The ratio between the fifth inductance value and the sixth inductance value is designed to be a first low-side impedance matching parameter. A source of the second transistor MT2 is electrically connected to the first end of the fourth inductor L4 to receive the second input power signal PI2. A gate of the second transistor MT2 receives a first bias voltage Vb1. A source of the third transistor MT3 is electrically connected to a drain of the second transistor MT2 and a gate of the third transistor MT3 receives a second bias voltage Vb2, wherein the third transistor MT3 is a high-voltage element. A first end of the second current-fed inductor FL2 is electrically connected to the source of the third transistor MT3 and the output match circuit 130 to output the output power signal POUT. A second end of the second current-fed inductor FL2 is electrically connected to the second system voltage VDD2. A source of the fourth transistor MT4 is electrically connected to the first end of the sixth inductor L6 to receive the second input power signal PI2. A gate of the fourth transistor MT4 receives the first bias voltage Vb1. A source of the fifth transistor MT5 is electrically connected to a drain of the fourth transistor MT4. A gate of the fifth transistor MT5 receives the second bias voltage Vb2, wherein the fifth transistor MT5 is a high-voltage element. A first end of the third current-fed inductor FL3 is electrically connected to a drain of the fifth transistor MT5 and the output match circuit 130 to output the output power signal POUT. A second end of the third current-fed inductor FL3 is electrically connected to the second system voltage VDD2.

For a specific instruction on an operational process of the RF power amplifier 300 of the present disclosure, at least one of the embodiments is for further instruction.

In the present embodiment, when the current unit gain amplifier 120 receives the AC signal, the first bias voltage Vb1 and the second bias voltage Vb2 is connected to AC ground, i.e., the gate of the second transistor MT2, the gate of the third transistor MT3, the gate of the fourth transistor MT4, and the gate of the fifth transistor MT5 can be regarded as electrically connected to the ground voltage. Because the second transistor MT2, the third transistor MT3, the fourth transistor MT4, and the fifth transistor MT5 are operated as CG configuration, the transimpedances of the second transistor MT2, the third transistor MT3, the fourth transistor MT4, and the fifth transistor MT5 are linear and the power gain is a limited value. The second transistor MT2 is substantially equal to the fourth transistor MT4. The third transistor MT3 is substantially equal to the fifth transistor MT5. Therefore, in the present disclosure, the impedance transformation circuit 110 with the third inductor L3, the fourth inductor L4, the fifth inductor L5, and the sixth inductor L6 is configured to electrically connect between the pre-stage circuit 101 and the current unit gain amplifier 120, thereby transforming the current outputted from the pre-stage circuit 101 through the magnetic energy conversion of the third inductor L3, the fourth inductor L4, the fifth inductor L5, and the sixth inductor L6 to increase the PAE of the pre-stage circuit 101. In the present disclosure, the third inductor L3 is substantially equal to the fifth inductor L5. The fourth inductor L4 is substantially equal to the sixth inductor L6. Before describing the following embodiment, it is worth noting that the signal outputted from the pre-stage circuit 101 is a differential input signal. The internal circuit of the RF power amplifier 300 receives the differential input signal by the architecture of the differential circuit. Moreover, the input impedance of the output match circuit 130 is a differential input resistor Rid. More specifically, when the third inductor L3 receives the current transmitted from the pre-stage circuit 101 or the first input power signal PI1, the third inductor L3 transmits the power to the fourth inductor L4 by the magnetic energy conversion, wherein the ratio between the current flowing through the fourth inductor L4 and the current flowing through the third inductor L3 is the first high-side impedance matching parameter. The first high-side impedance matching parameter is defined by the ratio between the third inductance value and the fourth inductance value. It is worth noting that the third inductor L3 and the fourth inductor L4 transform the input impedance into the output impedance based on the first high-side impedance matching parameter. When the first high-side impedance matching parameter is determined by the first system voltage VDD1, the second system voltage VDD2, and a first high-side predetermined power gain value, the designer can design the ratio between the third inductance value and the fourth inductance value based on the first high-side impedance matching parameter, thereby increasing the PAE of the RF power amplifier 300.

Next, the fourth inductor L4 transmits the differential current or the second input power signal PI2 to the second transistor MT2 and the third transistor MT3, wherein the third inductor L3 and the fourth inductor L4 transform the first input power signal PI1 into the second input power signal PI2 based on the first high-side impedance matching parameter. Because the amplification factor of the second transistor MT2 and the third transistor MT3 (i.e., the second transistor MT2 and the third transistor MT3 are operated as CG configuration) is substantially equal to 1, the second transistor MT2 and the third transistor MT3 of the present disclosure are analyzed from the power aspect. The power gain of the second transistor MT2 and the third transistor MT3 (i.e., the first high-side predetermined power gain value) is equal to the product between the half resistance value of the differential input resistor Rid and the transconductance value of the second transistor MT2. Therefore, the designer can design for an output power desired of the antenna to gain the resistance value of the differential input resistor Rid based on the second system voltage VDD2. The transconductance value of the second transistor MT2 is gained by the predetermined power gain value desired. The first high-side impedance matching parameter of the impedance transformation circuit 110 is determined by the first system voltage VDD1, the transconductance value of the second transistor MT2, and the output power provided from the pre-stage circuit 101 (i.e., the power gain of the RF power amplifier 300 is subtracted from the transmission power of the antenna). Similarly, the designer can do optimal design according to the aforementioned values. The present disclosure is not limited thereto. In other words, the second transistor MT2 and the third transistor MT3 determine the first high-side predetermined power gain value according to the half resistance value of the differential input resistor Rid. The power gain (i.e., the first high-side predetermined power gain value) of the second transistor MT2 and the third transistor MT3 are directly proportional to the resistance value of the differential input resistor Rid. Therefore, the designer can design for the first high-side predetermined power gain value desired and gain the resistance value of the differential input resistor Rid based on the first high-side predetermined power gain value. When the first high-side impedance matching parameter is determined by the first system voltage VDD1, the second system voltage VDD2, and the first high-side predetermined power gain value, the ratio between the third inductor L3 and the fourth inductor L4 can be determined by the first high-side impedance matching parameter.

Similarly, the third transistor MT3 transmits the output power signal POUT to the output match circuit 130 to execute the power matching of the output terminal. Then the output match circuit 130 transmits the RF output signal RFOUT to the antenna 102 to emit the signal correspondingly.

In another aspect, when the fifth inductor L5 receives the current transmitted from the pre-stage circuit 101 or the first input power signal PI1, the fifth inductor L5 transmits the power to the sixth inductor L6 by the magnetic energy conversion, wherein the ratio between the current flowing through the sixth inductor L6 and the current flowing through the fifth inductor L5 is a first low-side impedance matching parameter. The first low-side impedance matching parameter is defined by the ratio between the fifth inductance value and the sixth inductance value. It is worth to note that the fifth inductor L5 and the sixth inductor L6 transform the input impedance into the output impedance based on the first low-side impedance matching parameter. When the first low-side impedance matching parameter is determined by the first system voltage VDD1, the second system voltage VDD2, and a first low-side predetermined power gain value, the designer can design the ratio between the fifth inductance value and the sixth inductance value based on the first low-side impedance matching parameter, thereby increasing the PAE of the RF power amplifier 300.

Next, the sixth inductor L4 transmits the differential current or the second input power signal PI2 to the fourth transistor MT4 and the fifth transistor MT5, wherein the fifth inductor L5 and the six inductor L6 transform the first input power signal PI1 into the second input power signal PI2 based on the first low-side impedance matching parameter. Similarly, because the amplification factor of the second fourth transistor MT4 and the fifth transistor MT5 (i.e., the fourth transistor MT4 and the fifth transistor MT5 are operated as CG configuration) is substantially equal to 1, the fourth transistor MT4 and the fifth transistor MT5 of the present disclosure are analyzed from the power aspect. The power gain of the fourth transistor MT4 and the fifth transistor MT5 (i.e., the first low-side predetermined power gain value) is equal to the product between the half resistance value of the differential input resistor Rid and the transconductance value of the fourth transistor MT4. Therefore, the designer can design for an output power desired of the antenna to gain the resistance value of the differential input resistor Rid based on the second system voltage VDD2. The transconductance value of the fourth transistor MT4 is gained by the predetermined power gain value desired. The first low-side impedance matching parameter of the impedance transformation circuit 110 is determined by the first system voltage VDD1, the transconductance value of the second transistor MT2, and the output power provided from the pre-stage circuit 101 (i.e., the power gain of the RF power amplifier 300 is subtracted from the transmission power of the antenna). Similarly, the designer can do optimal design according to the aforementioned values. The present disclosure is not limited thereto. In other words, the fourth transistor MT4 and the fifth transistor MT5 determine the first low-side predetermined power gain value according to the half resistance value of the differential input resistor Rid.

The power gain (i.e., the first low-side predetermined power gain value) of the fourth transistor MT4 and the fifth transistor MT5 are directly proportional to the resistance value of the differential input resistor Rid. Therefore, the designer can design for the first low-side predetermined power gain value desired and gain the resistance value of the differential input resistor Rid based on the first low-side predetermined power gain value. When the first low-side impedance matching parameter is determined by the first system voltage VDD1, the second system voltage VDD2, and a first low-side predetermined power gain value, the ratio between the fifth inductance value and the sixth inductance value can be determined by the first low-side impedance matching parameter.

For a specific instruction on an operational process of the RF power amplifier 300 of the present disclosure, at least one of the embodiments is for further instruction.

In the following embodiments, only parts different from embodiments in FIG. 3 described, and the omitted parts are indicated to be identical to the embodiments in FIG. 3. In addition, similar reference numbers or symbols refer to the same elements.

[Another Embodiment of the RF Power Amplifier]

Figure 4:
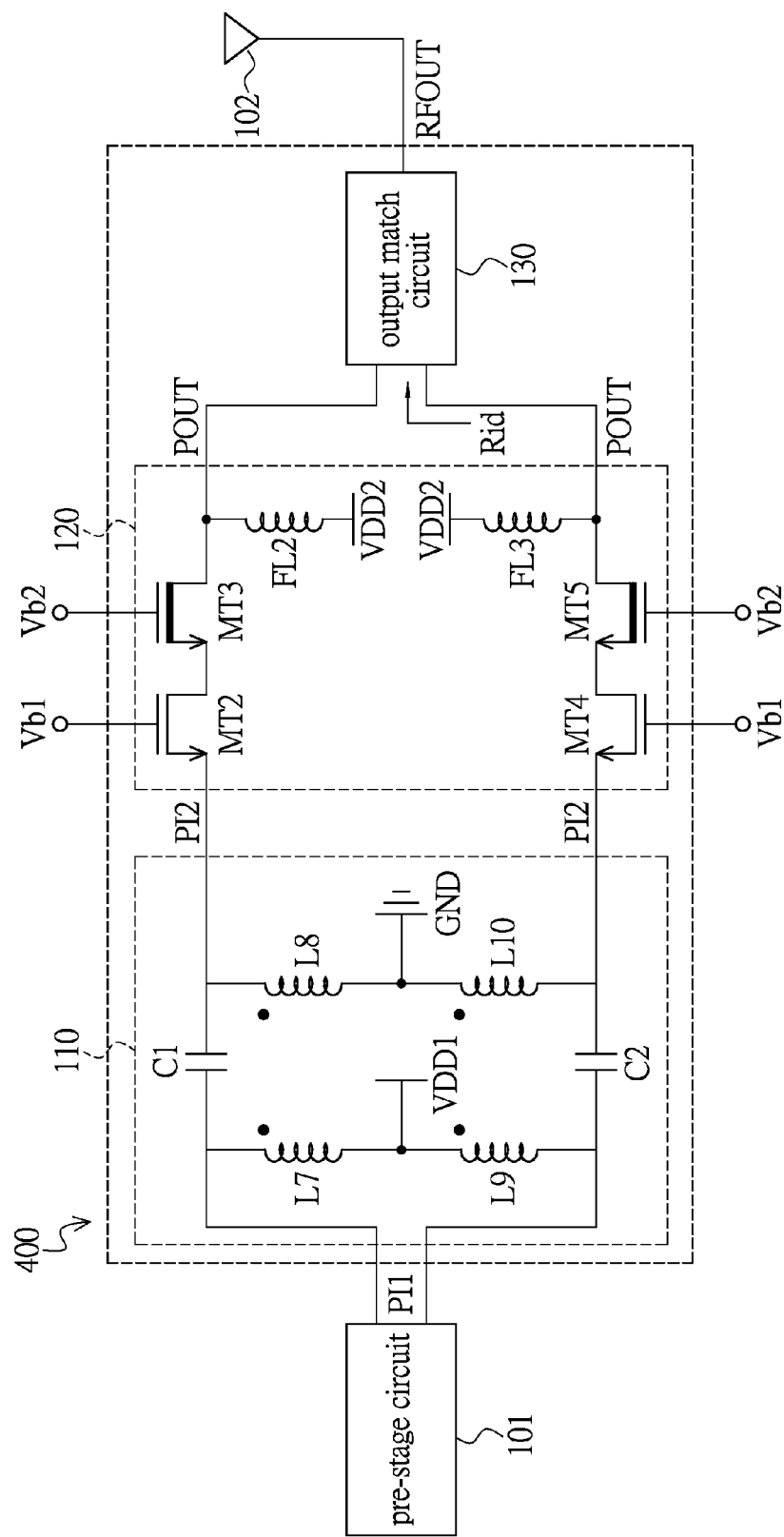
FIG. 4 is a block diagram of a RF power amplifier according to another exemplary embodiment of the present disclosure.

Please refer to FIG. 4, which shows a block diagram of a RF power amplifier according to another exemplary embodiment of the present disclosure. As shown in FIG. 4, the difference between this embodiment and the above-mentioned embodiment of FIG. 3 is that the impedance transformation circuit 110 includes a seventh inductor L7, an eighth inductor L8, a ninth inductor L9, a tenth inductor L10, a first capacitor C1, and a second capacitor C2. A first end of the seventh inductor L7 is electrically connected to the pre-stage circuit 101 to receive the first input power signal PI1. A second end of the seventh inductor L7 is electrically connected to the first system voltage VDD1. The seventh inductor L7 has a seventh inductance value. A first end of the first capacitor C1 is electrically connected to the first end of the seventh inductor L7. A first end of the eighth inductor L8 is electrically connected to a second end of the first capacitor C1 to output the second input power signal PI2. A second end of the eighth inductor L8 is electrically connected to the ground voltage GND. The eighth inductor L8 has an eighth inductance value, wherein the ratio between the seventh inductance value and the eighth inductance value is designed to be a second high-side impedance matching parameter. A first end of the ninth inductor L9 is electrically connected to the pre-stage circuit 101 to receive the first input power signal PI1. A second end of the ninth inductor L9 is electrically connected to the first system voltage VDD1. The ninth inductor L9 has a ninth inductance value. A first end of the second capacitor C2 is electrically connected to the first end of the ninth inductor L9. A first end of the tenth inductor L10 is electrically connected to a second end of the second capacitor C2 to output the second input power signal PI2. A second end of the tenth inductor L10 is electrically connected to the ground voltage GND. The tenth inductor L10 has a tenth inductance value, wherein the ratio between the ninth inductance value and the tenth inductance value is designed to be a second low-side impedance matching parameter.

Next, when the seventh inductor L7 receives the current transmitted from the pre-stage circuit 101 or the first input power signal PI1, the seventh inductor L7 transmits the power to the eighth inductor L8 through the first capacitor C1, wherein the ratio between the current flowing through the eighth inductor L8 and the current flowing through the seventh inductor L7 is a second high-side impedance matching parameter. The second high-side impedance matching parameter is defined by the ratio between the seventh inductance value and the eighth inductance value. It is worth noting that the seventh inductor L7 and the eighth inductor L8 transform the input impedance into the output impedance based on the second high-side impedance matching parameter. When the second high-side impedance matching parameter is determined by the first system voltage VDD1, the second system voltage VDD2, and a second high-side predetermined power gain value, the designer can design the ratio between the seventh inductance value and the eighth inductance value based on the second high-side impedance matching parameter, thereby increasing the PAE of the RF power amplifier 400. In another aspect, when the ninth inductor L9 receives the current transmitted from the pre-stage circuit 101 or the first input power signal PI1, the ninth inductor L9 transmits the power to the tenth inductor L10 through the second capacitor C2, wherein the ratio between the current flowing through the tenth inductor L10 and the current flowing through the ninth inductor L9 is a second low-side impedance matching parameter. The second high-side impedance matching parameter is defined by the ratio between the ninth inductance value and the tenth inductance value. It is worth to note that the ninth inductor L9 and the tenth inductor L10 transform the input impedance into the output impedance based on the second low-side impedance matching parameter. When the second low-side impedance matching parameter is determined by the first system voltage VDD1, the second system voltage VDD2, and a second low-side predetermined power gain value, the designer can design the ratio between the ninth inductance value and the tenth inductance value based on the second low-side impedance matching parameter, thereby increasing the PAE of the RF power amplifier 400. Other working mechanisms of the RF power amplifier 400 are the same as the aforementioned disclosure of the RF power amplifier 300 (as shown in FIG. 3), and further descriptions are hereinafter omitted.

[Embodiment of the Method for Increasing the Power Added Efficiency]

Figure 5:
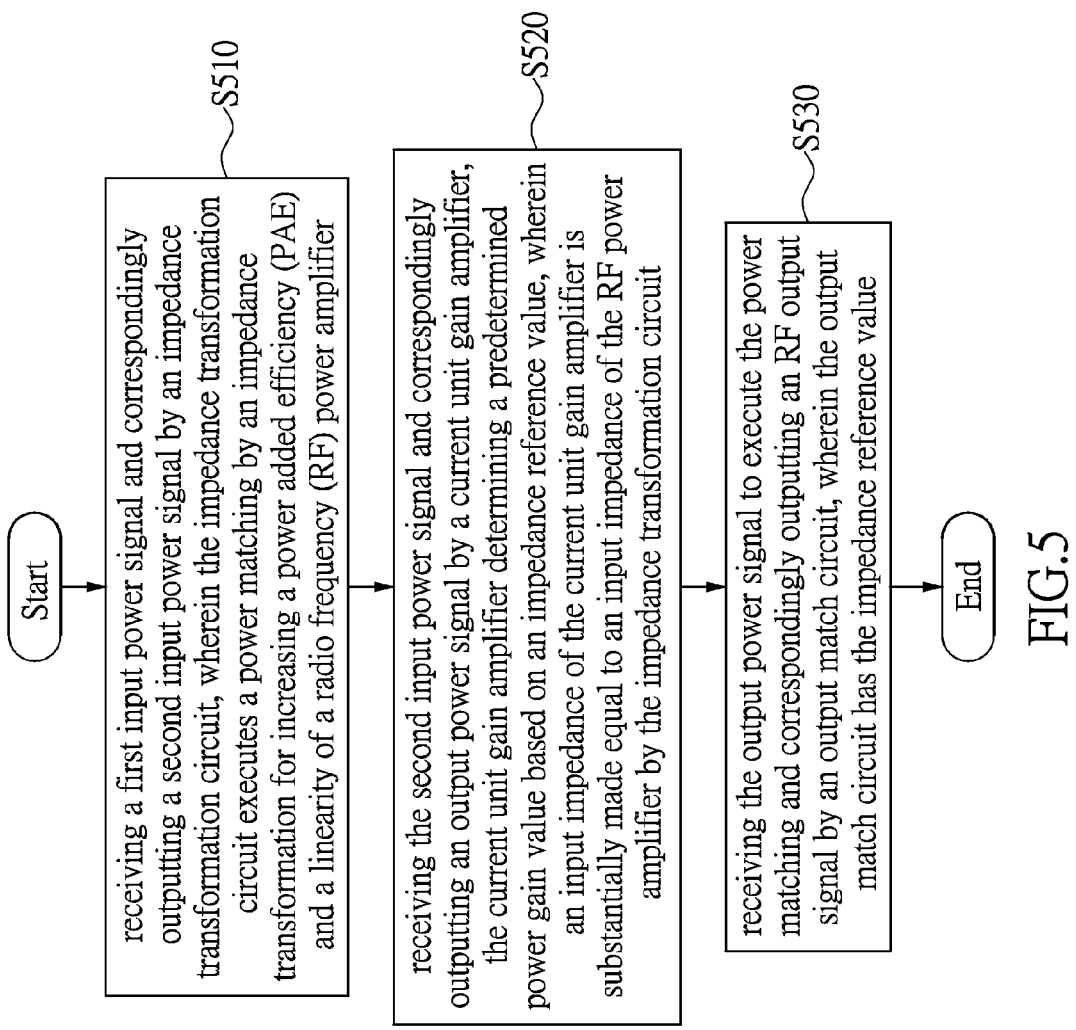
FIG. 5 is a flow diagram of a method for increasing a power added efficiency (PAE) according to an exemplary embodiment of the present disclosure.

Please refer to FIG. 5 in conjunction with FIGS. 1-4. FIG. 5 shows a flow diagram of a method for increasing power added efficiency (PAE) according to an exemplary embodiment of the present disclosure. From the aforementioned exemplary embodiments, the present invention may generalize a method for increasing the power added efficiency and the linearity, which is adapted for the aforementioned RF power amplifier 100, 200, 300 and 400. The method for increasing the power added efficiency and the linear is described as follows. First, receiving a first input power signal and correspondingly outputting a second input power signal through an impedance transformation circuit, wherein the impedance transformation circuit executes a power matching by an impedance transformation. Accordingly, it can adjust or further increase the PAE and the linearity of the RF power amplifier (Step S510). Next, receiving the second input power signal and correspondingly outputting an output power signal through a current unit gain amplifier. The current unit gain amplifier determines a predetermined power gain value based on an impedance reference value, wherein, by the impedance transformation circuit, the input impedance of the current unit gain amplifier is substantially equal to the input impedance of the RF power amplifier (Step S520). Afterwards, receiving the output power signal to execute the power matching through an output match circuit and then correspondingly outputting a RF output signal RFOUT, wherein the output match circuit has the impedance reference value (Step S530).

Relevant details of the steps of the method for increasing the PAE are illustrated in the embodiments of FIGS. 1-4, so their detailed description is omitted. It is clarified that, a sequence of steps in FIG. 5 is set for convenience, and thus the sequence of the steps is not used as a condition in demonstrating the embodiments of the present disclosure.

In summary, the exemplary embodiments of the present disclosure provides a RF power amplifier and a method for increasing the PAE, which can provide a linear transimpedance through a current unit gain amplifier to linearly transmit an input current to an output impedance and accordingly generate a linear output power for increasing the PAE of the current unit gain amplifier. Accordingly, it can increase the PAE and the linearity of the RF power amplifier in the condition of receiving a fixed input power.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A radio frequency (RF) power amplifier, electrically connected to a pre-stage circuit to receive a first input power signal, the RF power amplifier comprising:
    an impedance transformation circuit, electrically connected to the pre-stage circuit, configured for receiving the first input power signal and correspondingly outputting a second input power signal, wherein the impedance transformation circuit executes a power matching by an impedance transformation for increasing a power added efficiency (PAE) and a linearity of the RF power amplifier;
    a current unit gain amplifier, electrically connected to the impedance transformation circuit, configured for receiving the second input power signal and correspondingly outputting an output power signal, the current unit gain amplifier determining a predetermined power gain value based on an impedance reference value, wherein an input impedance of the current unit gain amplifier is substantially made equal to an input impedance of the RF power amplifier by the impedance transformation circuit; and
    an output match circuit, electrically connected to the current unit gain amplifier, having the impedance reference value for receiving the output power signal to execute the power matching, and correspondingly outputting a RF output signal.

2. The RF power amplifier according to claim 1, wherein the impedance transformation circuit comprises:
    a first inductor, a first end of the first inductor electrically connected to the pre-stage circuit for receiving the first input power signal, a second end of the first inductor electrically connected to a first system voltage, and the first inductor having a first inductance value; and a second inductor, a first end of the second inductor electrically connected to the current unit gain amplifier for outputting the second input power signal, a second end of the second inductor electrically connected to a ground voltage, and the second inductor having a second inductance value;

wherein an impedance matching parameter is defined by the ratio between the first inductance value and the second inductance value, and when the impedance matching parameter is determined by the first system voltage, a second system voltage, and the predetermined power gain value, the ratio between the first inductance value and the second inductance value is determined by the impedance matching parameter for adjusting the PAE and the linearity of the RF power amplifier.

3. The RF power amplifier according to claim 2, wherein the current unit gain amplifier comprises:

a first transistor, a source of the first transistor electrically connected to the first end of the second inductor for receiving the second input power signal, a gate of the first transistor electrically connected to a reference bias voltage; and a first current-fed inductor, a first end of the first current-fed inductor electrically connected to a drain of the first transistor and the output match circuit for outputting the output power signal, and a second end of the first current-fed inductor electrically connected to the second system voltage.

4. The RF power amplifier according to claim 1, wherein the impedance transformation circuit comprises:

a third inductor, a first end of the third inductor electrically connected to the pre-stage circuit for receiving the first input power signal, a second end of the third inductor electrically connected to a first system voltage, and the third inductor having a third inductance value;

a fourth inductor, a first end of the fourth inductor electrically connected to the current unit gain amplifier for outputting the second input power signal, a second end of the fourth inductor electrically connected to a ground voltage, and the fourth inductor having a fourth inductance value, wherein the ratio between the third inductance value and the fourth inductance value is designed to be a first high-side impedance matching parameter;

a fifth inductor, a first end of the fifth inductor electrically connected to the pre-stage circuit for receiving the first input power signal, a second end of the fifth inductor electrically connected to the first system voltage, and the fifth inductor having a fifth inductance value; and a sixth inductor, a first end of the sixth inductor electrically connected to the current unit gain amplifier for outputting the second input power signal, a second end of the sixth inductor electrically connected to the ground voltage, and the sixth inductor having a sixth inductance value, wherein the ratio between the fifth inductance value and the sixth inductance value is designed to be a first low-side impedance matching parameter;

wherein the third inductor and the fourth inductor transform the input impedance into the output impedance based on the first high-side impedance matching parameter for increasing the PAE and the linearity of the RF power amplifier;

wherein the fifth inductor and the sixth inductor transform the input impedance into the output impedance based on the first low-side impedance matching parameter for increasing the PAE and the linearity of the RF power amplifier;

wherein the impedance matching parameter comprises the first high-side impedance matching parameter and the first low-side impedance matching parameter.

5. The RF power amplifier according to claim 4, wherein the current unit gain amplifier comprises:

a second transistor, a source of the second transistor electrically connected to the first end of the fourth inductor for receiving the second input power signal, and a gate of the second transistor configured for receiving a first bias voltage;

a third transistor, a source of the third transistor electrically connected to a drain of the second transistor, and a gate of the third transistor configured for receiving a second bias voltage;

a second current-fed inductor, a first end of the second current-fed inductor electrically connected to a drain of the third transistor and the output match circuit for outputting the output power signal, and a second end of the second current-fed inductor electrically connected to a second system voltage;

a fourth transistor, a source of the fourth transistor electrically connected to the first end of the sixth inductor for receiving the second input power signal, and a gate of the fourth transistor configured for receiving the first bias voltage;

a fifth transistor, a source of the fifth transistor electrically connected to a drain of the fourth transistor, and a gate of the fifth transistor configured for receiving the second bias voltage; and a third current-fed inductor, a first end of the third current-fed inductor electrically connected to a drain of the fifth transistor and the output match circuit for outputting the output power signal, and a second end of the third current-fed inductor electrically connected to the second system voltage;

wherein the output match circuit has a differential input resistor;

wherein the second transistor and the third transistor determine a first high-side predetermined power gain value according to a half resistance value of the differential input resistor, and the fourth transistor and the fifth transistor determine a first low-side predetermined power gain value according to the half resistance value of the differential input resistor;

wherein the predetermined power gain value comprises the first high-side predetermined power gain value and the first low-side predetermined power gain value.

6. The RF power amplifier according to claim 5, wherein when the first high-side impedance matching parameter is determined by the first system voltage, the second system voltage, and the first high-side predetermined power gain value, the ratio between the first inductance value and the second inductance value is determined by the first high-side impedance matching parameter, and when the first low-side impedance matching parameter is determined by the first system voltage, the second system voltage, and the first low-side predetermined power gain value, the ratio between the fifth inductance value and the sixth inductance value is determined by the first low-side impedance matching parameter.

7. The RF power amplifier according to claim 1, wherein the impedance transformation circuit comprises:

a seventh inductor, a first end of the seventh inductor electrically connected to the pre-stage circuit for receiving the first input power signal, a second end of the seventh inductor electrically connected to a first system voltage, and the seventh inductor having a seventh inductance value;

a first capacitor, a first end of the first capacitor electrically connected to the first end of the seventh inductor;

an eighth inductor, a first end of the eighth inductor electrically connected to a second end of the first capacitor for outputting the second input power signal, a second end of the eighth inductor electrically connected to a ground voltage, and the eighth inductor has an eighth inductance value, wherein the ratio between the seventh inductance value and the eighth inductance value is designed to be a second high-side impedance matching parameter;

a ninth inductor, a first end of the ninth inductor electrically connected to the pre-stage circuit for receiving the first input power signal, a second end of the ninth inductor electrically connected to the first system voltage, and the ninth inductor has a ninth inductance value;

a second capacitor, a first end of the second capacitor electrically connected to the first end of the ninth inductor; and a tenth inductor, a first end of the tenth inductor electrically connected to a second end of the second capacitor for outputting the second input power signal, a second end of the tenth inductor electrically connected to the ground voltage, and the tenth inductor has a tenth inductance value, wherein the ratio between the ninth inductance value and the tenth inductance value is designed to be a second low-side impedance matching parameter;

wherein the seventh inductor and the eighth inductor transform the input impedance into the output impedance based on the second high-side impedance matching parameter for increasing the PAE and the linearity of the RF power amplifier;

wherein the ninth inductor and the tenth inductor transform the input impedance into the output impedance based on the second low-side impedance matching parameter for increasing the PAE and the linearity of the RF power amplifier;

wherein the impedance matching parameter comprises the second high-side impedance matching parameter and the second low-side impedance matching parameter.

8. A method for increasing a power added efficiency (PAE) and a linearity, adapted for a radio frequency (RF) power amplifier, the method comprising:

receiving a first input power signal and correspondingly outputting a second input power signal by an impedance transformation circuit, wherein the impedance transformation circuit executes a power matching by an impedance transformation for increasing the PAE and the linearity of the RF power amplifier;

receiving a second input power signal and correspondingly outputting an output power signal by a current unit gain amplifier, the current unit gain amplifier determining a predetermined power gain value based on an impedance reference value, wherein an input impedance of the current unit gain amplifier is substantially made equal to an input impedance of the RF power amplifier by the impedance transformation circuit; and receiving the output power signal to execute the power matching and correspondingly outputting a RF output signal by an output match circuit, wherein the output match circuit has the impedance reference value.

9. The method according to claim 8, wherein the impedance transformation circuit comprises:

a first inductor, a first end of the first inductor electrically connected to the pre-stage circuit for receiving the first input power signal, a second end of the first inductor electrically connected to a first system voltage, and the first inductor having a first inductance value; and a second inductor, a first end of the second inductor electrically connected to the current unit gain amplifier for outputting the second input power signal, a second end of the second inductor electrically connected to a ground voltage, and the second inductor having a second inductance value;

wherein an impedance matching parameter is defined by the ratio between the first inductance value and the second inductance value, and when the impedance matching parameter is determined by the first system voltage, a second system voltage, and the predetermined power gain value, the ratio between the first inductance value and the second inductance value is determined by the impedance matching parameter for adjusting the PAE and the linearity of the RF power amplifier.

10. The method according to claim 9, wherein the current unit gain amplifier comprises:

a first transistor, a source of the first transistor electrically connected to the first end of the second inductor for receiving the second input power signal, a gate of the first transistor electrically connected to a reference bias voltage; and a first current-fed inductor, a first end of the first current-fed inductor electrically connected to a drain of the first transistor and the output match circuit for outputting the output power signal, and a second end of the first current-fed inductor electrically connected to the second system voltage.

11. The method according to claim 8, wherein the impedance transformation circuit further comprises:

a third inductor, a first end of the third inductor electrically connected to the pre-stage circuit for receiving the first input power signal, a second end of the third inductor electrically connected to a first system voltage, and the third inductor having a third inductance value;

a fourth inductor, a first end of the fourth inductor electrically connected to the current unit gain amplifier for outputting the second input power signal, a second end of the fourth inductor electrically connected a ground voltage, and the fourth inductor having a fourth inductance value, wherein the ratio between the third inductance value and the fourth inductance value is designed to be a first high-side impedance matching parameter;

a fifth inductor, a first end of the fifth inductor electrically connected to the pre-stage circuit for receiving the first input power signal, a second end of the fifth inductor electrically connected to the first system voltage, and the fifth inductor having a fifth inductance value; and a sixth inductor, a first end of the sixth inductor electrically connected to the current unit gain amplifier for outputting the second input power signal, a second end of the sixth inductor electrically connected to the ground voltage, and the sixth inductor having a sixth inductance value, wherein the ratio between the fifth inductance value and the sixth inductance value is designed to be a first low-side impedance matching parameter;

wherein the third inductor and the fourth inductor transform the input impedance into the output impedance based on the first high-side impedance matching parameter for increasing the PAE and the linearity of the RF power amplifier;

wherein the fifth inductor and the sixth inductor transform the input impedance into the output impedance based on the first low-side impedance matching parameter for increasing the PAE and the linearity of the RF power amplifier;

wherein the impedance matching parameter comprises the first high-side impedance matching parameter and the first low-side impedance matching parameter.

12. The method according to claim 11, wherein the current unit gain amplifier further comprises:

a second transistor, a source of the second transistor electrically connected to the first end of the fourth inductor for receiving the second input power signal, and a gate of the second transistor configured for receiving a first bias voltage;

a third transistor, a source of the third transistor electrically connected to a drain of the second transistor, and a gate of the third transistor configured for receiving a second bias voltage;

a second current-fed inductor, a first end of the second current-fed inductor electrically connected to a drain of the third transistor and the output match circuit for outputting the output power signal, and a second end of the second current-fed inductor electrically connected to a second system voltage;

a fourth transistor, a source of the fourth transistor electrically connected to the second end of the sixth inductor for receiving the second input power signal, and a gate of the fourth transistor configured for receiving the first bias voltage;

a fifth transistor, a source of the fifth transistor electrically connected to a drain of the fourth transistor, and a gate of the fifth transistor configured for receiving the second bias voltage; and a third current-fed inductor, a first end of the third current-fed inductor electrically connected to a drain of the fifth transistor and the output match circuit for outputting the output power signal, and a second end of the third current-fed inductor electrically connected to the second system voltage;

wherein the output match circuit has a differential input resistor;

wherein the second transistor and the third transistor determine a first high-side predetermined power gain value according to a half resistance value of the differential input resistor, and the fourth transistor and the fifth transistor determine a first low-side predetermined power gain value according to the half resistance value of the differential input resistor;

wherein the predetermined power gain value comprises the first high-side predetermined power gain value and the first low-side predetermined power gain value.

13. The method according to claim 12, wherein when the first high-side impedance matching parameter is determined by the first system voltage, the second system voltage, and the first high-side predetermined power gain value, the ratio between the first inductance value and the second inductance value is determined by the first high-side impedance matching parameter, and when the first low-side impedance matching parameter is determined by the first system voltage, the second system voltage, and the first low-side predetermined power gain value, the ratio between the fifth inductance value and the sixth inductance value is determined by the first low-side impedance matching parameter.

14. The method according to claim 8, wherein the impedance transformation circuit further comprises:

a seventh inductor, a first end of the seventh inductor electrically connected to the pre-stage circuit for receiving the first input power signal, a second end of the seventh inductor electrically connected to a first system voltage, and the seventh inductor having a seventh inductance value;

a first capacitor, a first end of the first capacitor electrically connected to the second end of the seventh inductor;

an eighth inductor, a first end of the eighth inductor electrically connected to a second end of the first capacitor for outputting the second input power signal, a second end of the eighth inductor electrically connected to a ground voltage, and the eighth inductor has an eighth inductance value, wherein the ratio between the seventh inductance value and the eighth inductance value is designed to be a second high-side impedance matching parameter;

a ninth inductor, a first end of the ninth inductor electrically connected to the pre-stage circuit for receiving the first input power signal, a second end of the ninth inductor electrically connected to the first system voltage, and the ninth inductor has a ninth inductance value;

a second capacitor, a first end of the second capacitor electrically connected to the first end of the ninth inductor; and a tenth inductor, a first end of the tenth inductor electrically connected to a second end of the second capacitor for outputting the second input power signal, a second end of the tenth inductor electrically connected to the ground voltage, and the tenth inductor has a tenth inductance value, wherein the ratio between the ninth inductance value and the tenth inductance value is designed to be a second low-side impedance matching parameter;

wherein the seventh inductor and the eighth inductor transform the input impedance into the output impedance based on the second high-side impedance matching parameter for increasing the PAE and the linearity of the RF power amplifier;

wherein the ninth inductor and the tenth inductor transform the input impedance into the output impedance based on the second low-side impedance matching parameter for increasing the PAE and the linearity of the RF power amplifier;

wherein the impedance matching parameter comprises the second high-side impedance matching parameter and the second low-side impedance matching parameter.

* * * * *